(12) United States Patent
Okandan

(10) Patent No.: US 9,501,738 B1
(45) Date of Patent: Nov. 22, 2016

(54) CELLULAR COMPUTATIONAL PLATFORM AND NEURALLY INSPIRED ELEMENTS THEREOF

(71) Applicant: Sandia Corporation, Albuquerque, NM (US)

(72) Inventor: Murat Okandan, Edgewood, NM (US)

(73) Assignee: Sandia Corporation, Albuquerque, NM (US)

( * ) Notice: Subject to any disclaimer, the term of this patent is extended or adjusted under 35 U.S.C. 154(b) by 536 days.

(21) Appl. No.: 13/966,127

(22) Filed: Aug. 13, 2013

Related U.S. Application Data

(60) Provisional application No. 61/684,085, filed on Aug. 16, 2012, provisional application No. 61/769,030, filed on Feb. 25, 2013.

(51) Int. Cl.
*G06N 3/067* (2006.01)

(52) U.S. Cl.
CPC .................. *G06N 3/067* (2013.01)

(58) Field of Classification Search
None
See application file for complete search history.

(56) References Cited

U.S. PATENT DOCUMENTS

| | | | | |
|---|---|---|---|---|
| 4,809,193 | A * | 2/1989 | Jourjine ........................... | 706/40 |
| 4,959,532 | A * | 9/1990 | Owechko ................... | 250/201.9 |
| 5,087,826 | A * | 2/1992 | Holler et al. ................... | 706/38 |
| 5,355,528 | A * | 10/1994 | Roska et al. ................... | 706/38 |
| 8,748,797 | B1 * | 6/2014 | Decker et al. ............ | 250/214 R |
| 2002/0038294 | A1 * | 3/2002 | Matsugu .......................... | 706/20 |
| 2005/0152694 | A1 * | 7/2005 | Chown ........................... | 398/30 |

OTHER PUBLICATIONS

"A High-Performance Hybrid Electrical-Optical Interconnection Technology for High-Speed Electronic Systems", Elmar Griese, Advanced Packaging, IEEE Transactions on, vol. 24, Issue 3, Aug. 2001, pp. 375-383.*
"Cellular Neural Networks: Theory", Leon O. Chua, Lin Yang, Circuits and Systems, IEEE Transactions on 1988, vol. 35, Issue 10, pp. 1257-1272.*
"A 16x16 Cellular Neural Network Universal Chip: The First Complete Single-Chip Dynamic Computer Array with Distributed Memory and with Gray-Scale Input-Output", J. M. Cruz, L. O. Chua, Analog Integrated Circuits and Signal Processing, Mar. 1998, vol. 15, Issue 3, pp. 227-237.*
"Electrical and optical on-chip interconnects in scaled microprocessors", Chen et al, Circuits and Systems, 2005, ISCAS 2005, IEEE International Symposium on, May 23-26, 2005, vol. 3, pp. 2514-2517.*

(Continued)

*Primary Examiner* — Kakali Chaki
*Assistant Examiner* — Mai T Tran
(74) *Attorney, Agent, or Firm* — Martin I. Finston

(57) ABSTRACT

A cellular computational platform is disclosed that includes a multiplicity of functionally identical, repeating computational hardware units that are interconnected electrically and optically. Each computational hardware unit includes a reprogrammable local memory and has interconnections to other such units that have reconfigurable weights. Each computational hardware unit is configured to transmit signals into the network for broadcast in a protocol-less manner to other such units in the network, and to respond to protocol-less broadcast messages that it receives from the network. Each computational hardware unit is further configured to reprogram the local memory in response to incoming electrical and/or optical signals.

7 Claims, 7 Drawing Sheets

(56) References Cited

OTHER PUBLICATIONS

"Optical cellular processor architecture. 1: Principles", Jean Taboury, J. M. Wang, Pierre Chavel, F. Devos, Patrick Garda, Applied Optics, 27 No. 9, 1988, pp. 1643-1650.*

Cassidy et al., "Cognitive Computing Building Block: A Versatile and Efficient Digital Neuron Model for Neurosynaptic Cores," www.research.ibm.com/software/IBMResearch/multimedia/IJCNN2013.neuron-model.pdf, downloaded Aug. 13, 2013.

Esser, et al., "Cognitive Computing Systems: Algorithms and Applications for Networks of Neurosynaptic Cores," www.research.ibm.com/software/IBMReasearch/multimedia/IJCNN2013.algorithms-applications.pdf , downloaded Aug. 13, 2013.

"Hierarchical Temporal Memory including HTM Cortical Learning Algorithms," Numenta, Inc., Version 0.2.1, Sep. 12, 2011.

IBM Research: Neurosynaptic chips, "Neurosynaptic chips Building Blocks for Cognitive Systems," www.research.ibm.com/cognitive-computing/neurosynaptic-chips,shtml downloaded Aug. 8, 2013.

Merolla, et al., "A Digital Neurosynaptic Core Using Embedded Crossbar Memory with 45pj per Spike in 45nm," www.modha.org/papers/012.CICC1.pdf , downloaded Aug. 13, 2013.

Okandan, M., "Neuro-inspired Computation: Beyond Stored Program Architecture and Moore's Law Limits," Neuro-Inspired Computational Elements Workshop, Feb. 25-27, 2013, Albuquerque, NM.

Okandan., "Neuro-inspired Computation: Beyond Stored Program Architecture and Moore's Law Limits," International Workshop on Brain-Inspired Computing, Cetraro, Italy, Jul. 8-11, 2013.

Amir, A. et al., "Cognitive Computing Programming Paradigm: A Corolet Language for Composing Networks of Neurosynatptic Cores," www.research.ibm.com/software/IBMResearch/multimedia/IJCNN2013.corolet-language.pdf. Aug. 4-9, 2013, 10 pages.

Okandan, M., "Neuro-inspired Computational Engines: Beyond Stored Program Architecture and Moore's Law Limits: Workshop Goals," Neuro-Inspired Computational Elements Workshop, Feb. 12, 2013, Albuquerque, NM.

Okandan, M., "Neuro-inspired Computation: Beyond Stored Program Architecture and Moore's Law Limits," International Workshop, Cetraro, Italy, Jul. 7-11, 2013.

Okandan, M., "Neuro-inspired Computational Engines: Beyond Stored Program Architecture and Moore's Law Limits," DARPA, pre-BAA, Jun. 26-27, 2013.

* cited by examiner

CELLULAR COMPUTATIONAL PLATFORM AND NEURALLY INSPIRED ELEMENTS THEREOF

CROSS-REFERENCE TO RELATED APPLICATIONS

This application claims priority under the provisions of 35 U.S.C. §119(e) to U.S. Provisional Application No. 61/684,085 filed on Aug. 16, 2012 and to U.S. Provisional Application No. 61/769,030, filed on Feb. 25, 2013.

This invention was developed under Contract DE-AC04-94AL85000 between Sandia Corporation and the U.S. Department of Energy. The U.S. Government has certain rights in this invention.

TECHNICAL FIELD

The present invention is directed generally to computational platforms that solve problems by the collective behavior of large numbers of individual nodes as inspired, for example, by the behavior of neurons and nervous systems. The invention is more particularly directed to architectures and architectural building blocks of such neuro-inspired platforms.

ART BACKGROUND

Neuro-inspired computation has the potential for becoming the next revolution in computational systems, opening possibilities for transcending the limitations of von Neumann and Turing architectures and of Moore's Law. Neural networks and other neuro-inspired computational approaches have long been a subject of research. However, many of these approaches have been realized only in simulations implemented on digital computers. Relatively few have been implemented directly on hardware platforms specifically designed for neuro-inspired operations. Of those specialized hardware platforms that have been implemented, some are scalable only to a limited degree because spatial constraints limit the number of electrical interconnections that can be made between individual unit cells. Hence there remains a need for further approaches to neuro-inspired computation and for new architectures for platforms to support such approaches.

SUMMARY OF THE INVENTION

We have devised a basic computational block, referred to here as a "unit block", that may emulate basic computational functionality in the brain. Our unit block can couple electrical and optical functionality even at the lowest possible device level.

We have also developed an architecture that leverages this unit block and can provide massive interconnectivity as well as plasticity (i.e., reconfigurability), as is seen in biological neural systems. Our architecture and unit block can be implemented in a solid-state substrate. In implementations, the unit blocks are assembled into a unit cell that has optical and electrical inputs, control signals, and outputs, and also has internal memory that enables time-dependent and history-dependent behavior of the system.

In implementations, the specific designs and interconnections of the unit blocks may be directed to represent different portions and/or activities of a neuronal structure. For example, a dendritic network and its synapses may be emulated. Of course implementations are not limited to those that directly mimic biological systems.

When the basic units of a system communicate only electrically, the need for geometrical separation between signal-carrying conductors imposes an inherent geometrical limit on the density of interconnections. We have transcended this limit by providing a unit block that can couple inputs and/or outputs entirely in the electrical or optical domains, or across domains.

Although purely electrical networks can typically achieve no more than a few hundred connections per device, the synaptic connections in biological systems typically range from one thousand to ten thousand per cell. In implementations, our network can approach such massive interconnectivity through optical connections that employ multiplexing techniques such as wavelength-division, time-division, and code-division multiplexing.

In a broad aspect, the invention involves a cellular computational platform that includes a multiplicity of functionally identical, repeating computational hardware units that are interconnected electrically and optically. Optical interconnections are also provided between units that are sufficiently far apart, and possibly even between each unit and its near neighbors. Each computational hardware unit includes a reprogrammable local memory and has interconnections to other such units that have reconfigurable weights. The weights may be determined, for example, according to data stored in the local memory or data otherwise based on a combination of electrical and/or optical device properties.

Each computational hardware unit is configured to transmit signals into the network for broadcast in a protocol-less manner to other such units in the network, and to respond to protocol-less broadcast messages that it receives from the network. By this is meant that there is no explicit routing information included as part of the transmitted data. Thus, this is distinct from, e.g., datagram transmission in which routing information is included in appended headers. Instead, such routing as might be provided is inherent in the network configuration, including the weights that may be dynamically assigned to specific interconnections, or is the consequence of specific channel assignments.

Each computational hardware unit is further configured to reprogram the local memory in response to incoming electrical and/or optical signals.

In another aspect, our invention is a computational hardware apparatus comprising at least one unit cell of a cellular computational platform such as the platform described above. A unit cell in such an apparatus includes an electrical interconnection pattern, an optical interconnection pattern, and multiple functionally identical, repeating unit blocks that are interconnected via the electrical and optical interconnection patterns. The unit cell also includes a long-range unit connected to the electrical interconnection pattern, the optical interconnection pattern, or both. The long-range unit is an electro-optical circuit configured to transmit and receive optical signals via a long-range optical transmission medium. Each unit block includes at least one reprogrammable memory, and includes circuitry for processing signals in a combination of the electrical and optical domains, wherein said processing is responsive to information stored in the reprogrammable memory. The unit cell is configured to connect to other unit cells over interconnections that have reconfigurable weights, to transmit electrical and optical signals into the network for broadcast in a protocol-less manner to other unit cells in the cellular computational platform, and to respond to protocol-less electrical and optical broadcast messages that it receives from other unit cells in the cellular computational platform.

DETAILED DESCRIPTION

Figure 1:
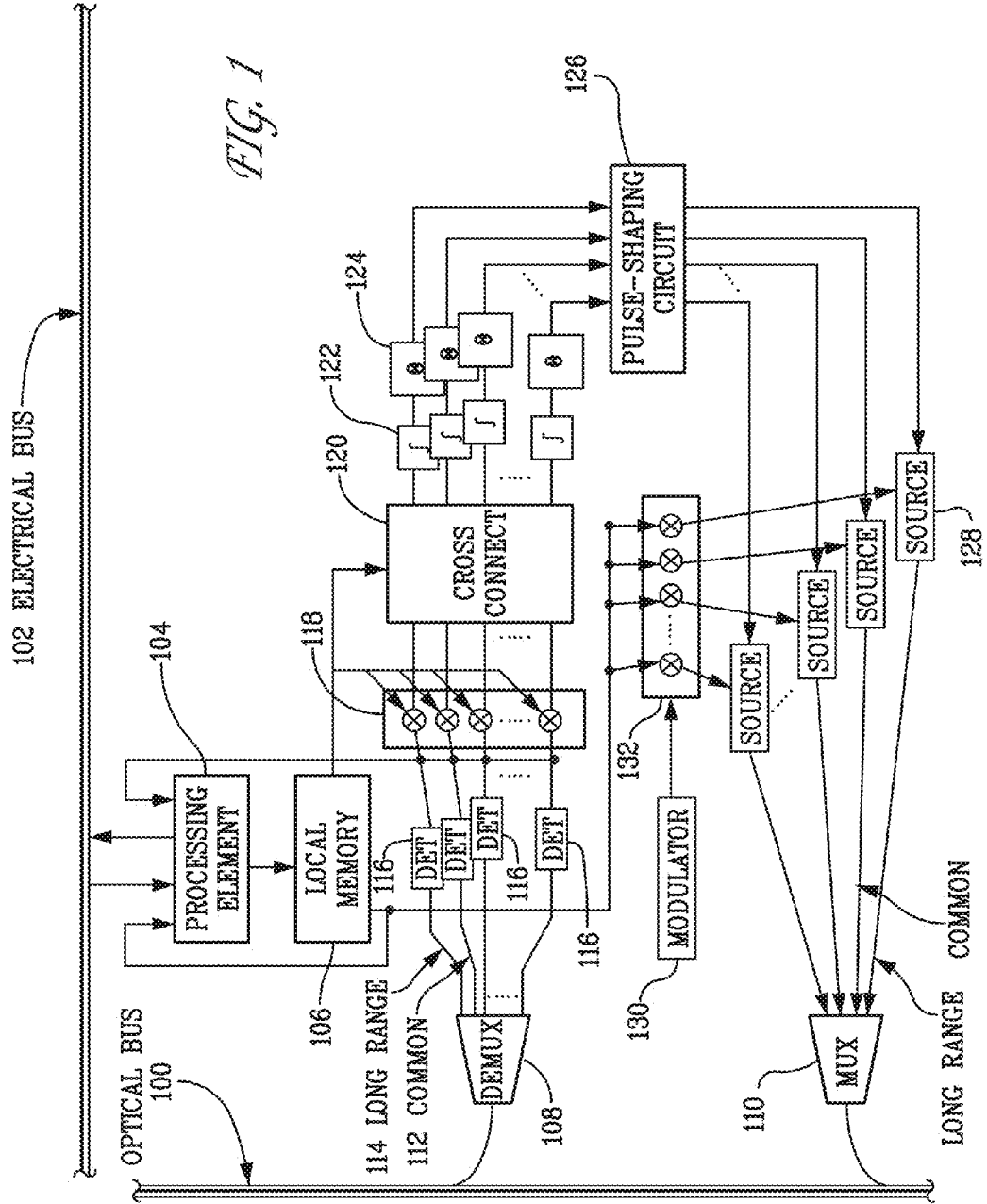
FIG. 1 provides a high-level schematic diagram of a computational hardware unit in one example implementation.

Biological neural networks are known to exhibit spike-timing dependent plasticity (STDP). In this type of behavior, a neuron that integrates temporally and spatially separated inputs will fire in response to a sufficient total input if the time delay between respective inputs is small enough. Moreover, the neuron exhibits learning behavior in that a response by the integrating neuron becomes more likely over time as effective stimulation events are repeated. Implementations of our architecture are readily applicable to emulation of such behavior. It should also be noted, however, that even though not programmed directly into the architecture, STDP may emerge as a consequence of lower-level architectural features.

As will be seen below, implementations of our architecture include connectivity on three different scales: local, mid-range, and long-range. These distinctions are important, not least because biological systems are believed to compute partly by spatially (as well as temporally) modulating the neural activity; hence, to emulate these systems it will be desirable to exercise similar control over the spatial distribution of cooperative excitation.

As noted above, a computational hardware unit in our architectural hierarchy is a fundamental building block that includes a reprogrammable local memory and has interconnections to other such units that are reconfigurably weighted according, for example, to data in the local memory or are otherwise based on electrical and/or optical device properties. Each computational hardware unit is configured to transmit signals into the network for broadcast in a protocol-less manner to other such units in the network, and to respond to protocol-less broadcast messages that it receives from the network. Each computational hardware unit is further configured to reprogram the local memory in response to incoming electrical and/or optical signals.

A unit block, which may be a single computational hardware unit or may be built up from a plurality of computational hardware units, is a lower level functional entity that can be replicated many times to build up a unit cell. The unit cell, in turn, can be replicated many times to build up, e.g., the analog of a cortical column as seen in biological systems. Within the unit cell, unit blocks may be organized into layers, or sheets. Within a given layer, the unit blocks will have similar functionality and similar connectivity. However, the unit blocks in different sheets may have different functionalities and different connectivities.

Electrical and optical signals provide the local and mid-range connectivity in unit blocks and unit cells. Optical signals provide the long-range connectivity, as well as the distributed connectivity that will also be needed. Optical signals that are locally generated and/or modified are passed to further spatial regions by using a long-range unit, which may e.g. be part of at least some unit cells. For example, a local neighborhood may consist of a cluster of 5-100 unit cells. If the unit cells are arranged, e.g., in a two-dimensional hexagonal packed array, the local neighborhood about a given cell might extend as far as, and include, the fifth-nearest neighbors of the given cell. It should be noted in this regard that the long-range optical transmission will require relatively high levels of power. The long-range units will thus be adapted to operate at the necessary power levels. A long-range unit may include, e.g., a VCSEL and/or a photodiode.

In biological systems, the timescales for neural computation range from milliseconds (spiking times) to seconds (accommodation), and even to minutes, days, and years for short-term memory, long-term memory, and muscle memory, respectively. All such timescales may be emulated in our architecture by appropriate coupling of the functionalities available in the various unit blocks.

Of course external electrical and even optical circuitry of conventional kinds may be used for diagnosis and control of the neural architecture. For example, external control circuitry might be used to activate or deactivate learning in the system. Thus, the system could be trained to a certain performance level, at which it would remain after the learning capability is disabled. The trained configuration could then be replicated onto further, similarly arranged substrates without a need to train the further substrates.

FIG. 1 provides a high-level schematic diagram of a computational hardware unit in one example implementation. As seen in the figure, optical and electrical signals come in and out on, respectively, an optical bus 100 and an electrical bus 102. The electrical input and output signals are mediated by a processing element 104, which also interrogates and reprograms the local memory 106. Although not explicitly shown in the figure, electrical input and output signals are potentially multiplexed on a plurality of different channels using, e.g., code, time, or radiofrequency (rf) frequency multiplexing techniques. Different channels might be used, for example, for communicating with different classes of neighbor units, or for different processing layers, or for purposes of feedback to the originating unit.

For the optical input and output signals, FIG. 1 shows respectively a demultiplexer 108 and a multiplexer 110 for use in the event there are multiple optical channels. In addition to the multiplexing techniques listed above, the optical channels may also be multiplexed by optical wavelength multiplexing, among other techniques. In the example of the figure, one optical channel 112 is labeled as "common". It is meant for broadcast to all optically connected units, and each such unit would also receive signals on the same common channel.

It should be noted in this regard that optical signals may be progressively attenuated by optical drops at successive network nodes, by progressive splitting in a branching network, by divergence in a two-dimensional optical confining medium, or from other causes. Such attenuation may in some cases be useful as a natural way to limit the range of certain optical interconnections, or to gradually reduce the weight of certain such interconnections as the distance to the receiving node increases. A further channel represented in the figure is the "long-range" channel 114, which is meant, specifically, to distribute signal energy into the medium for long-range transmissions as described above.

With further reference to the figure, it will be seen that each demultiplexed optical channel is directed to a detector 116, such as a diode detector, for conversion to an electrical signal. In response to output from the local memory, the output from each detector is multiplied 118 by a respective weight. Weights may be continuously valued or binary valued. In addition, weights may potentially be negative-valued, as will be explained below.

The weighted signals are directed to a cross-connect 120 (as shown in the figure) or similar device which transfers signal energy from a set of input ports to a set of output ports. The number of active output ports may be less than, the same as, or greater than the number of active input ports. Within the cross-connect device, input signals may be individually transferred to one or more designated output ports, selected sums of input signals may be so transferred, and designated input signals may be interrupted so as not to produce corresponding output.

Input signals that have been weighted with "negative" values may be combined with other input signals so as to reduce the amount of signal energy directed to a corresponding output port. Such negative signals are to some extent analogous to inhibitory signals in biological nervous systems.

The cross-connections, port selections, sums, and interruptions are determined in response to output from the local memory and input and control signals.

As seen in the figure, the cross-connect output signals are integrated 122 over a time window and subjected to a thresholding procedure 124. This is to some extent analogous to a process observed in biological neurons, in which coincidences of incoming action potentials lead to a responsive neural firing if they sum to a supra-threshold value. The thresholded responses in each output channel activate a respective pulse-shaping circuit 126, which causes a corresponding optical source 128, such as a diode laser, to emit a pulse of light. The modulator circuit 130 for each optical source applies 132 a respective weight, as determined by output from the local memory.

As also seen in the figure, the processing element 104 receives input not only from the electrical bus 102, but also from the optical bus 100. That is, a signal portion is tapped off of the output of each of the optical detectors and directed to an input port of the processing element. It should be noted in this regard that the signals that are input to the processing element can include feedback from the output of its own computational hardware unit.

It should be noted that our architecture is very flexible in the sense that the individual computational hardware units may be implemented individually so that each is functionally analogous to a biological neuron, or they may be grouped in various ways. For example, one or more interconnected computational hardware units may collectively compose a unit block, and one or more interconnected unit blocks may compose a unit cell, which then may be repeated many times.

Moreover, two or more distinct arrays of unit cells may be disposed as respective processing layers. For example, in one simple arrangement, there may be an input processing layer, an intermediate processing layer, and an output processing layer. Interconnections between the respective processing layers may be determined by data stored in the various local memories. The interconnections may provide for progressive unidirectional signal flow from system input ports, to the lowest layers, to the next higher layers, etc., to the system output ports.

The interconnections may also provide for signal flow that skips layers and that reverses direction so as to provide feedback to lower layers. Accordingly, the computational hardware units or their aggregations may variously bear analogies to neurons, portions of neurons, cortical columns, and the like.

The input to the system will typically consist of a spatiotemporal matrix. That is, during each of a sequence of discrete time windows, a vector of signal values will be applied to an array of corresponding input ports, thus distributing the signal (at each given time) over space. Initialization of the system will typically be carried out by setting operational parameters in the various local memories so as to define an initial configuration for the network topology, including the set of weights that affect the various interconnections. Initialization may be performed, e.g., through electrical signals, and whether carried out electrically, optically, or both, it may be performed using signal channels reserved for such purpose.

Depending on how the processing element is configured, the operational parameters may evolve as a consequence of analog or digital operations. In an example analog operation, portions of output signals are simply tapped off and fed back to set values in the local memory that correspond to new parameter values. Such feedback signals may of course be discretized or converted to binary values. In digital operations, appropriately configured logic circuits may set new parameter values in response to inputs indicative of network conditions. In implementations of sufficient complexity, such logic circuits may be programmed as part of the initialization process.

It should be noted that in operation, signals may be subject to recombination not only over space, but also over time. For example, in an arrangement having multiple processing layers, each processing layer may have a respective processing delay. Consequently, the passing of signals between layers can lead to the combining of responses originally stimulated by input vectors associated with different time windows. Of course through the operation of the local memories, it will also be possible for network conditions in one time window to affect the processing in subsequent time windows.

The cellular computational platform will have many possible uses. One such use is for predicting the next value in a scalar, or more typically, vector-valued sequence of input symbols. A system configured for predictive behavior of that kind can be useful for control and other applications, and can also be useful as a research device for investigating the behavior of artificial as well as biological nervous systems.

In a typical scenario, the system is trained by an input sequence. In each time window, the generated prediction for the next symbol is compared with the actual next symbol. A difference function, which may or may not be linear, is computed and fed back as an error signal to the network. Back-propagation networks are well known to investigators in the field of neural networks generally, and at least some of the known techniques can likewise be applied in the context of the present invention. In one example of a nonlinear approach to the computation of error signals, a penalty is computed using known Bayesian methods, possibly with modifications to avoid unduly penalizing predictions that are highly improbable but still admissible.

The input sequences may be multimodal. That is, any type of data that can be transduced into an electrical signal might be used as input. Hence, potential sources of input might include, individually or in combination, any types of data streams, including for example video and audio streams, engine diagnostics, radar signals, twitter feeds, and the like. Although input would typically be in digital format, the possibility of direct analog input should not be excluded. Of course the network might include an interface layer for conditioning the input signals and possibly for recoding the input signals into an advantageous format.

In operation, the system processes its input stream in accordance with its internal model, which is reflected in the dynamic behavior of the system and determined by the pattern of synchronization and desynchronization of the individual computational hardware units or, more typically, of their aggregates at any of various levels. By this, we mean that each pattern of units (at the appropriate level) that are in an active state during a given time window can represent information, and likewise each sequence of such patterns from one time window to the next, and even to still later time windows, can represent information.

Moreover, spatial or temporal correlations in such patterns can represent respective information states that are correspondingly correlated. In particular, if a certain pattern A is consistently followed by a certain other pattern B, then after several repeat occurrences of the A→B sequence, A can begin to be established as a predictor of B.

In simple implementations, the activation patterns will be determined by the sets of weights applied to the interconnections. However, in more complex implementations, more complex local rules define the pattern and change dynamically due, for example, to responses stimulated by back-propagated data.

Figure 2:
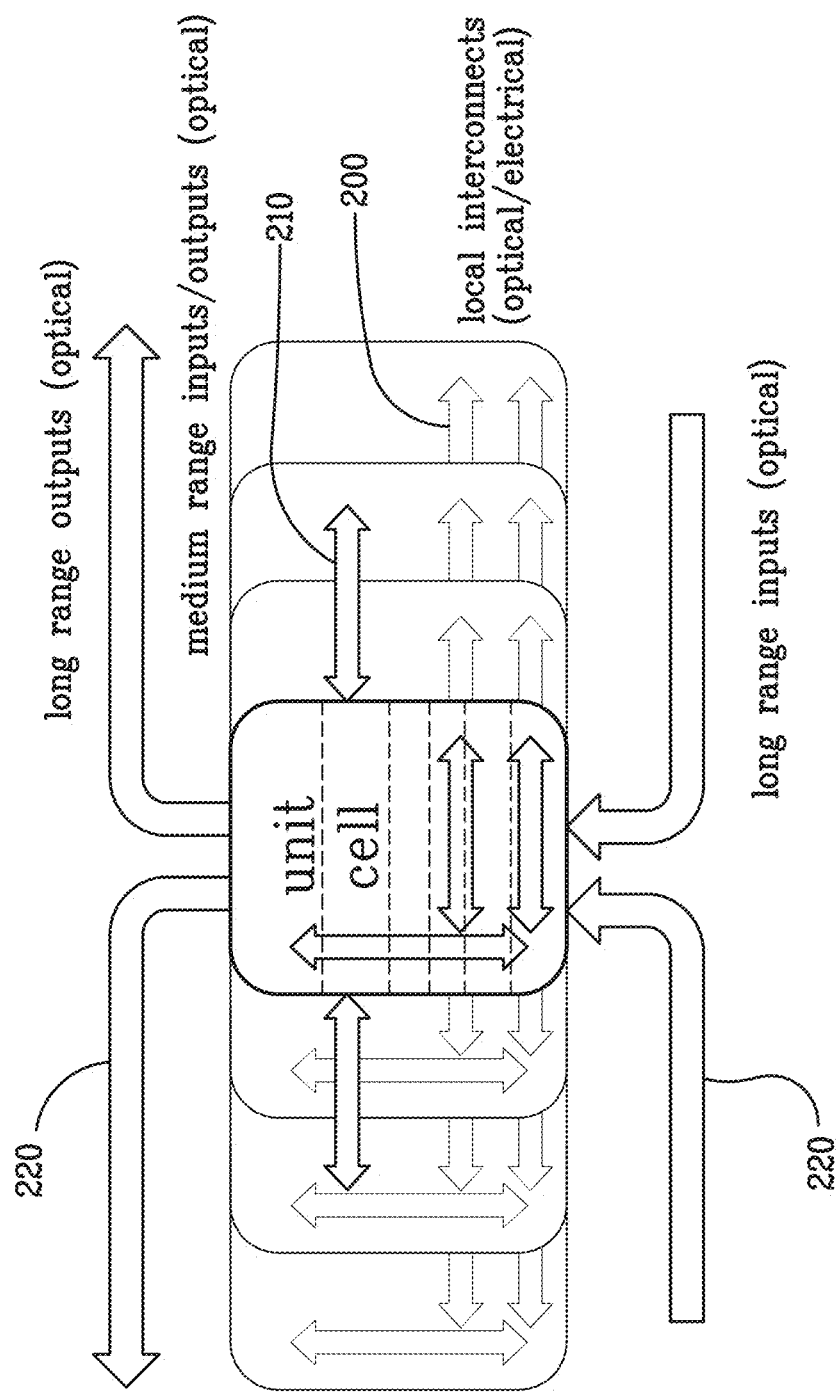
FIG. 2 provides a high-level schematic view of an example unit cell, with further unit cells indicated in the background of the figure. The three types of interconnection are also schematically represented in the figure.

The architecture of the cellular computational platform will typically have unit blocks aggregated into repetitive unit cells, and will typically have three types of interconnection, distinguished by range. FIG. 2 provides a high-level schematic view of an example unit cell, with further unit cells indicated in the background of the figure. The three types of interconnection are also schematically represented in the figure.

Local interconnections 200 are defined as interconnections within unit cells (or unit blocks in some possible implementations) and between a unit cell (or block) and its nearest neighbors. These interconnections will typically be both electrical and optical, but in some implementations may be electrical only. Near-local (or "medium-range") interconnections 210 are defined as interconnections between unit cells (or blocks) separated by 210 nearest-neighbor distances. They will typically be both electrical and optical. As seen in the figure, there may be respective long-range connections 220 dedicated for input and output, or the same connections may be used for both.

Long-range interconnections 220 are defined as interconnections between unit cells (or blocks) separated by more than ten nearest-neighbor distances. The long-range interconnections will typically be optical. The use of optical media for the long-range interconnections is advantageous because it avoids the spatial constraints that limit the fan-out of electrical connections.

In at least some implementations, it will be advantageous for, e.g. 20% of the connections to be long-range, and for the remaining 80% to be short-range and mid-range. This ratio is similar to what is seen in biological nervous systems.

It should be noted in this regard that one form of signaling in biological tissues takes place by the chemical diffusion of messenger molecules. Such signaling is inherently localized because of the progressive rarefaction of the messenger species as it diffuses outward from its source. An analogous effect can be provided in the system described here by the progressive attenuation, through loss or through geometrical spreading, of outgoing signals with distance from their sources.

In an example implementation, a long-range unit is included in each unit cell. In other implementations, a long-range unit may even be included in some or all unit blocks, whereas in other implementations a long-range unit may serve an aggregate of unit cells.

Figure 3:
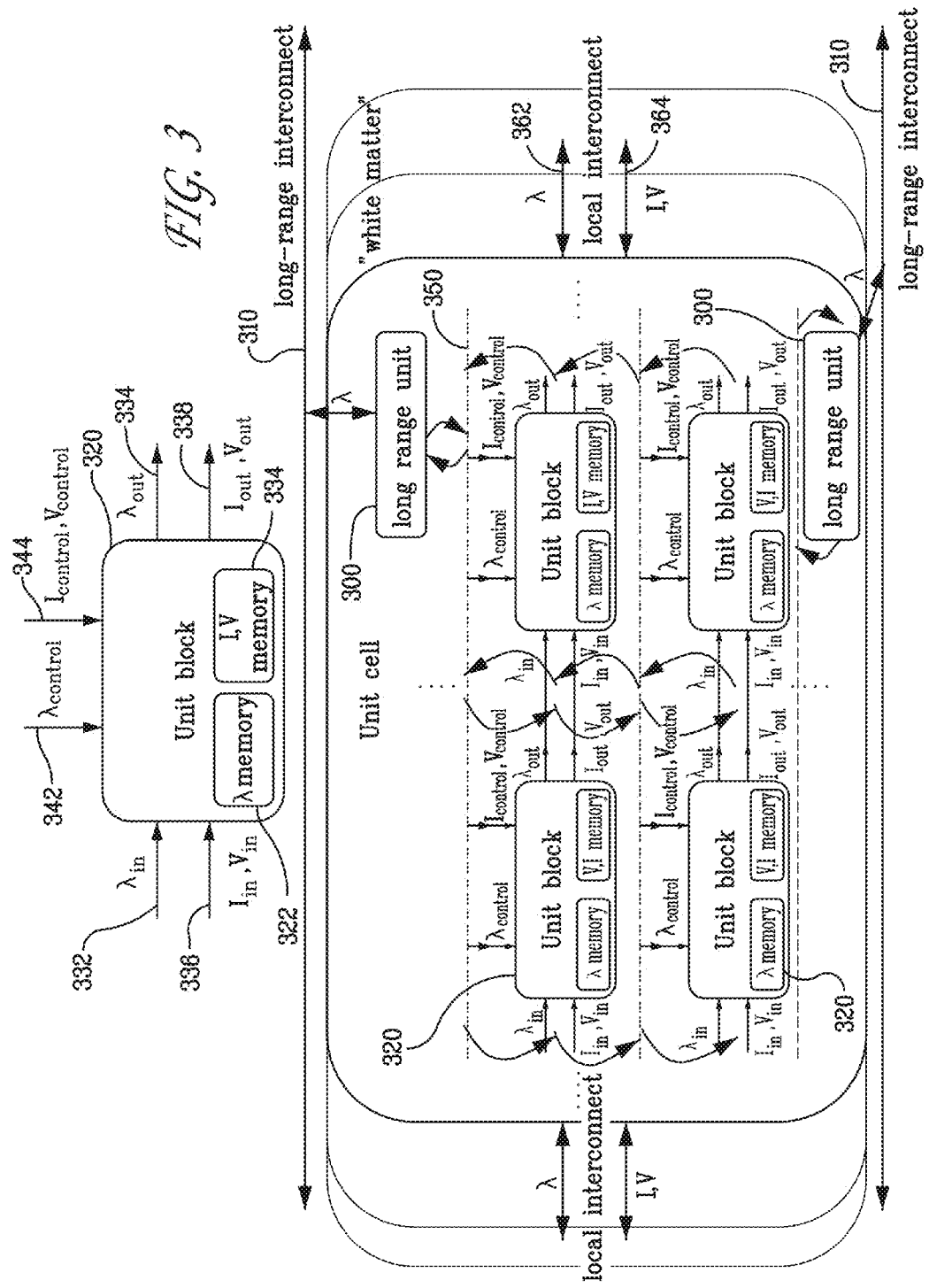
FIG. 3 provides a schematic drawing of one example unit cell that includes a long-range unit.

FIG. 3 provides a schematic drawing of one example unit cell that includes a long-range unit 300. The long-range unit includes an optical transceiver (not shown) that broadcasts into a waveguide tree network or other type of optical network 310. The transmissions are at a relatively high optical power, so that they can be received in good condition even at relatively great distances within the network. The long-range transmissions, in particular, do not use protocol-based addressing. Instead, the transmissions are protocol-free, and to the extent they are directed to specific destination unit blocks, such direction is provided directly by the network configuration and possibly by code, wavelength, or other channel assignment.

The long range unit also serves as an aggregator and de-aggregator of signals respectively outgoing from or incoming to the unit cell (or other unit element) that it serves. That is, the long range unit mediates between the local and near-local channels in its own neighborhood, and the long-range channels. Hence, any unit cell (for example) in some implementations will be able to communicate with any other relatively distant unit cell by transmitting to its local long-range unit, which forwards the communication on a long-range channel for disaggregation and distribution by a counterpart long-range unit at the receiving end.

It should be noted in this regard that in other implementations, it might be more cost-effective if some aggregations of unit cells (or other unit elements) communicate with each other indirectly, i.e. through the mediation of other such aggregations if for example they process respective aspects of the input matrix that relate to each other only at a high level.

It should likewise be noted that in some implementations, it is possible that the output from a given unit will be fed back to that same unit after propagating outward and then back inward, with or without modification, over a long-range channel.

Advantageously, the network also includes an overlay network, possibly implemented through the electrical bus, that provides direct access to an external monitor for observation and diagnosis of the state of the network, and for direct control over the states of individual, targeted network elements.

With further reference to FIG. 3, it will be seen that the unit cell of the figure includes a plurality of unit blocks 320, and that (as best seen in the inset portion of the figure), each unit block includes an optical memory 322 and an electrical memory 324. With further reference to the figure, and especially to the inset, it will be seen that each unit block 320 has respective optical signal inputs 332 and outputs 334, respective electrical signal inputs 336 and outputs 338, and respective optical and electrical control inputs 342, 344. It will be seen further that a near-local electrical and optical interconnection medium 350 conveys control input and signal input and output among the unit blocks and between the unit blocks and the long-range unit. It will be seen further that the unit cell has respective external local optical and electrical interconnections 362, 364.

In an example scenario for using a system of the kind described here, the system controls the movement of a robotic arm. The signal inputs to the system consist of facsimiles of the electrical inputs to the actuators of the robotic arm, outputs of a set of sensors monitoring the mechanical response of the arm, and a video stream containing image data representing the state of the arm. The signal output from the system includes a prediction of the next mechanical state of the arm, and a command to move the arm to the next position as needed to perform a prescribed action. The system output is fed back into the control loop as a portion of the input data.

Figure 4:
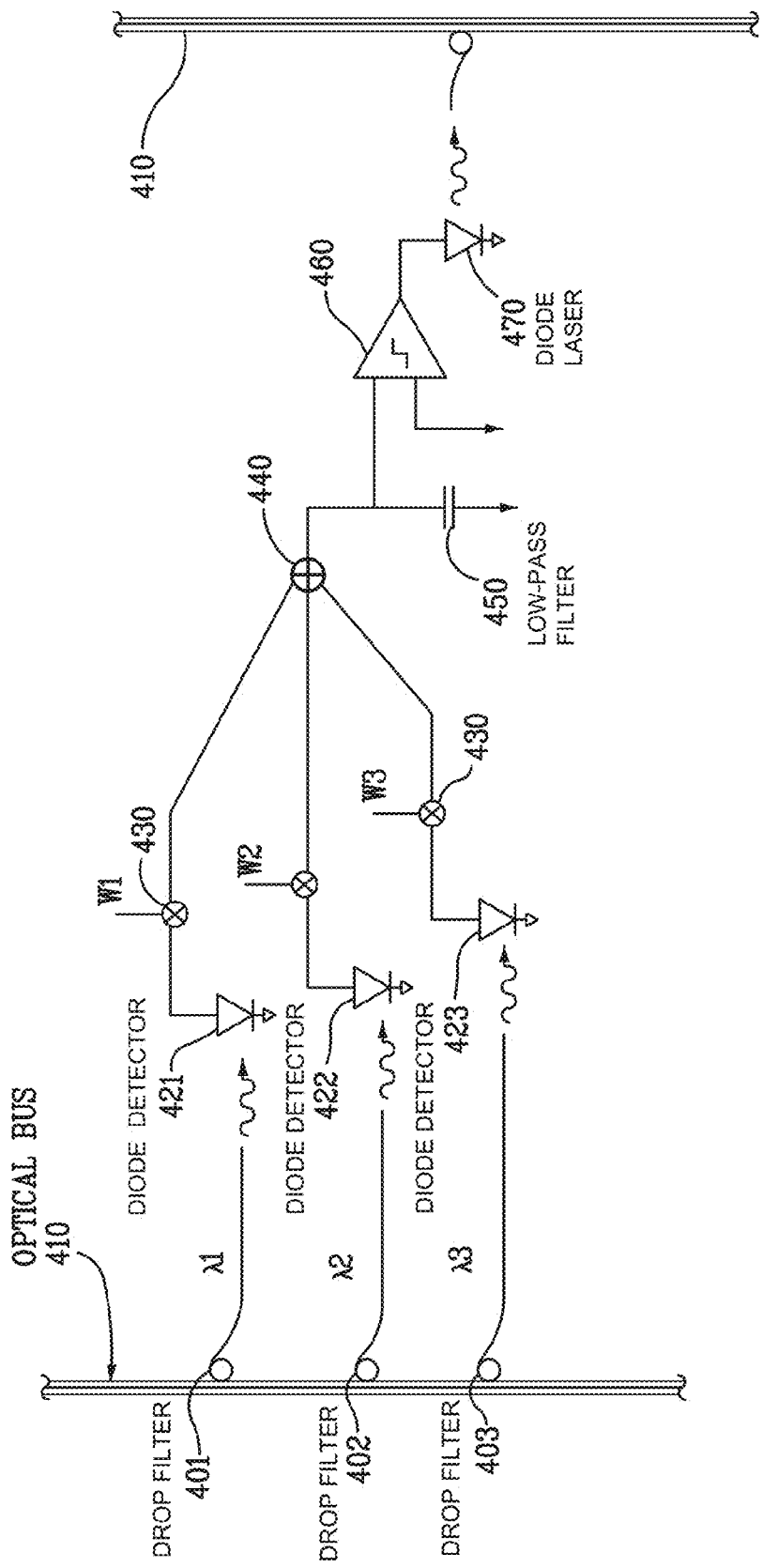
FIG. 4 provides a schematic diagram illustrating, by way of example, a simple circuit that emulates the activity of a single neuron, and which may be included as part of a computational hardware unit.

FIG. 4 provides a schematic diagram illustrating, by way of example, a simple circuit that emulates the activity of a single neuron, and which may be included as part of a computational hardware unit. As seen in the figure, three drop filters 401-403 tap off optical signals from the optical bus 410 in respective wavelength channels labeled $\lambda 1$, $\lambda 2$, and $\lambda 3$. Each signal is transduced to the electrical domain by a respective diode detector 421-423. The three resulting electrical signals are multiplied 430 by respective weights W1, W2, and W3, summed 440, and integrated over time by a low-pass filter 450. The filtered output from the summing element is directed to a comparator 460 which generates a pulse if its input exceeds a specified threshold. The pulsed output from the comparator drives a diode laser 470, which injects a corresponding optical pulse back into the optical bus. Of course the total number of optical channels may vary over a broad range, and may include inhibitory channels as well as excitatory channels. As noted above, the weights will typically be provided from a local memory. An adaptive process analogous to learning in biological nervous systems can be simply implemented by increasing some or all of the weights in the illustrated system whenever there is an incoming pulse coincidence of sufficient magnitude to excite an output optical pulse.

Figure 5:
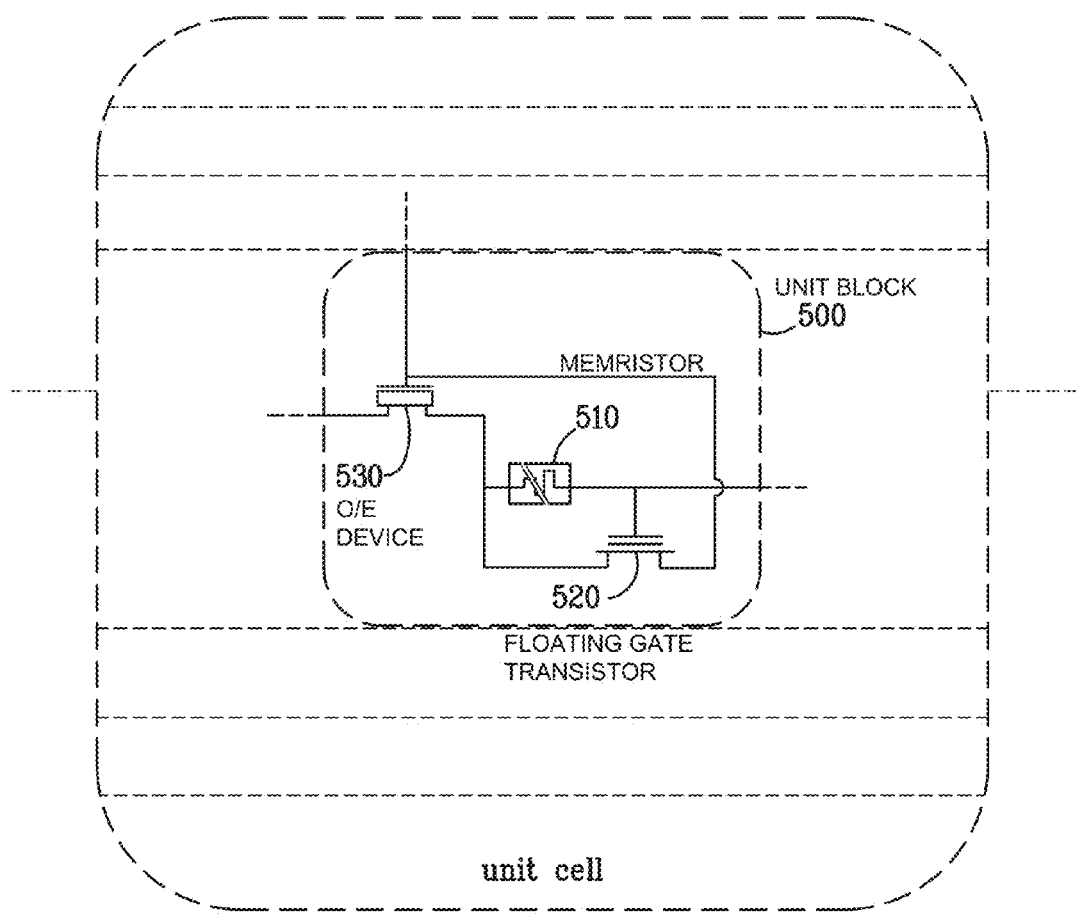
FIG. 5 provides a notional block diagram for a unit cell, in which one unit block is shown explicitly.

FIG. 5 provides a notional block diagram for a unit cell, in which one unit block 500 is shown explicitly. The unit block is replicated multiple times, as indicated by broken lines in the figure. Several basic devices shown in the figure are illustrative of types of devices that may be used to implement a unit block, but it should be understood that the devices illustrated are merely exemplary and not intended to be limiting. Near the center of the figure is a memristor 510 of a kind that is optically modifiable. That is, the resistance state of the memristor may be set by an optical pulse, or the optical pulse may set the next response of the memristor to an optical or electrical write signal. Alternatively, the device shown may be the converse of a memristor in which, for example, the state of the index of refraction of the device is set by an electrical signal. To the lower right of the memristor is a floating gate transistor memory element 520. To the upper left of the memristor is a silicon nanowire optoelectronic device 530.

Figure 6:
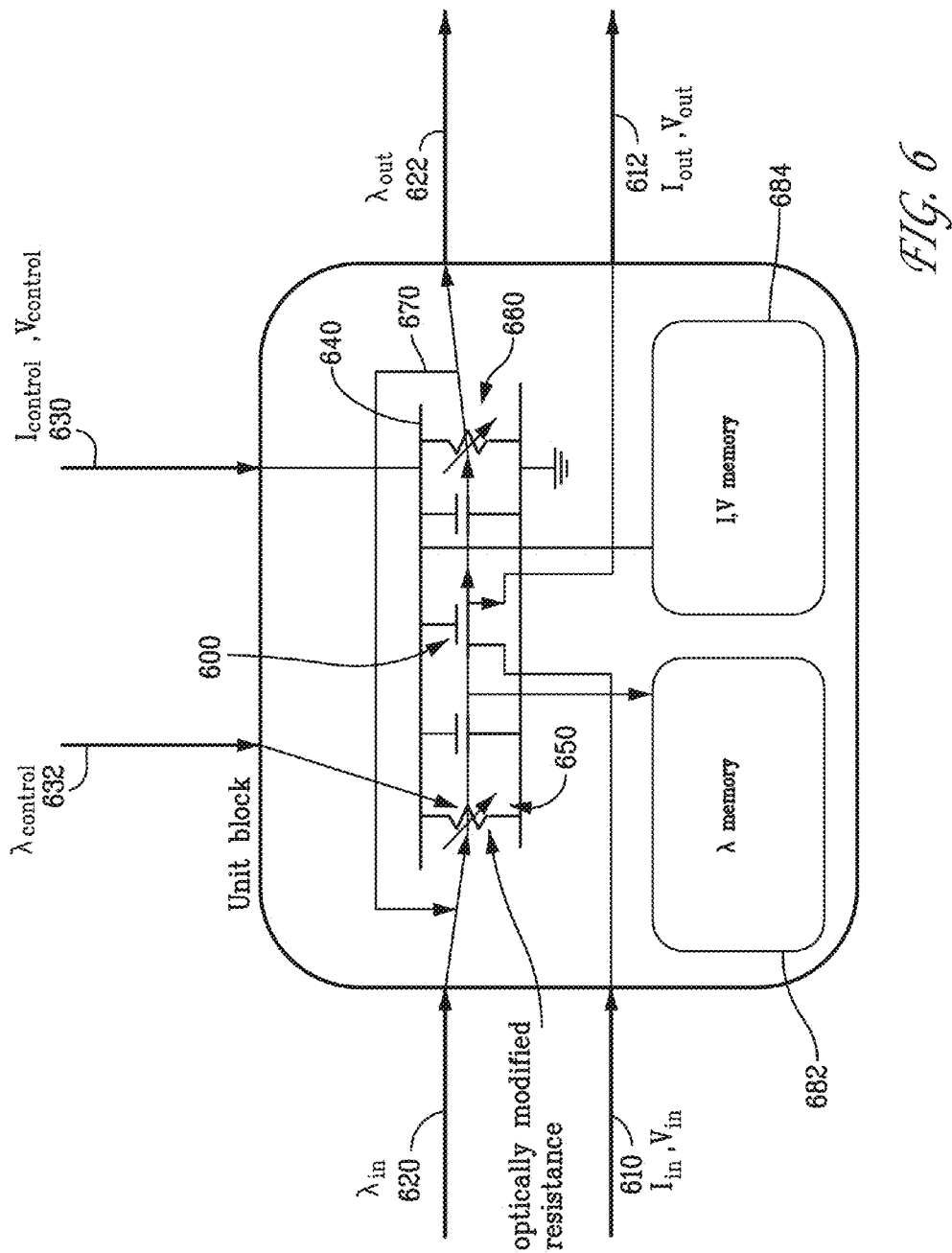
FIG. 6 provides a schematic diagram of circuitry in another example of a unit block.

FIG. 6 provides a schematic diagram of circuitry in another example of a unit block. As seen in the figure, a coupled electro-optic device 600 responds to electrical input 610 and optical input 620 by generating respective electrical and optical outputs 612, 622. Electrical control 630 is distributed by electrical medium 640. Optical control 632 is delivered to the optical input of optical memristor 650, where such input may modify the resistance of the memristor.

The optical output of device 600 may be effective to modify the resistance of optical memristor 660. A portion 670 of the optical output may be tapped off and fed back to the input to optical memristor 650.

As will be understood by those skilled in the art, a memristor in general is written with a stored data value according to the history of current applied across it, and it is read according to the instantaneous current or voltage across it. In an optically modified memristor, light impinging on the device further modifies the stored value. This stored value could be applied as a connection weight, or as another circuit variable for internal representation or control of a further circuit element.

Information stored in the respective local optical and electrical memories 682, 684 may further influence the output response of the unit block.

Although the functionality of a computational hardware unit or unit block is readily provided using a combination of conventional circuit elements, the properties of advanced devices could be very advantageous in at least some implementations. The silicon nanowire device, for example, offers the possibility of integrating both optical and electronic processing functionality. The electronic functionality is provided because the silicon nanowire functions as the channel of a field-effect device. The optical functionality is provided because recent research shows that the silicon nanowire can be clad with an epitaxial layer of III-V material. It is known that such materials can be engineered to guide, emit, detect, and modulate light.

The memory functions of a unit block are important not least because they can be used to determine the respective weights of interconnections to other unit blocks, unit cells, or other hierarchical levels. In this respect, learning can be implemented by the adaptation of the various weights, for example according to well-known approaches in the training of conventional neural networks. However, this is only one of many modes in which our architecture can be used. For example, our unit block may include basic devices that are inherently self-limiting, and that therefore do not necessarily require external direction in order to effectuate modifications in functionality or connectivity.

Figure 7:
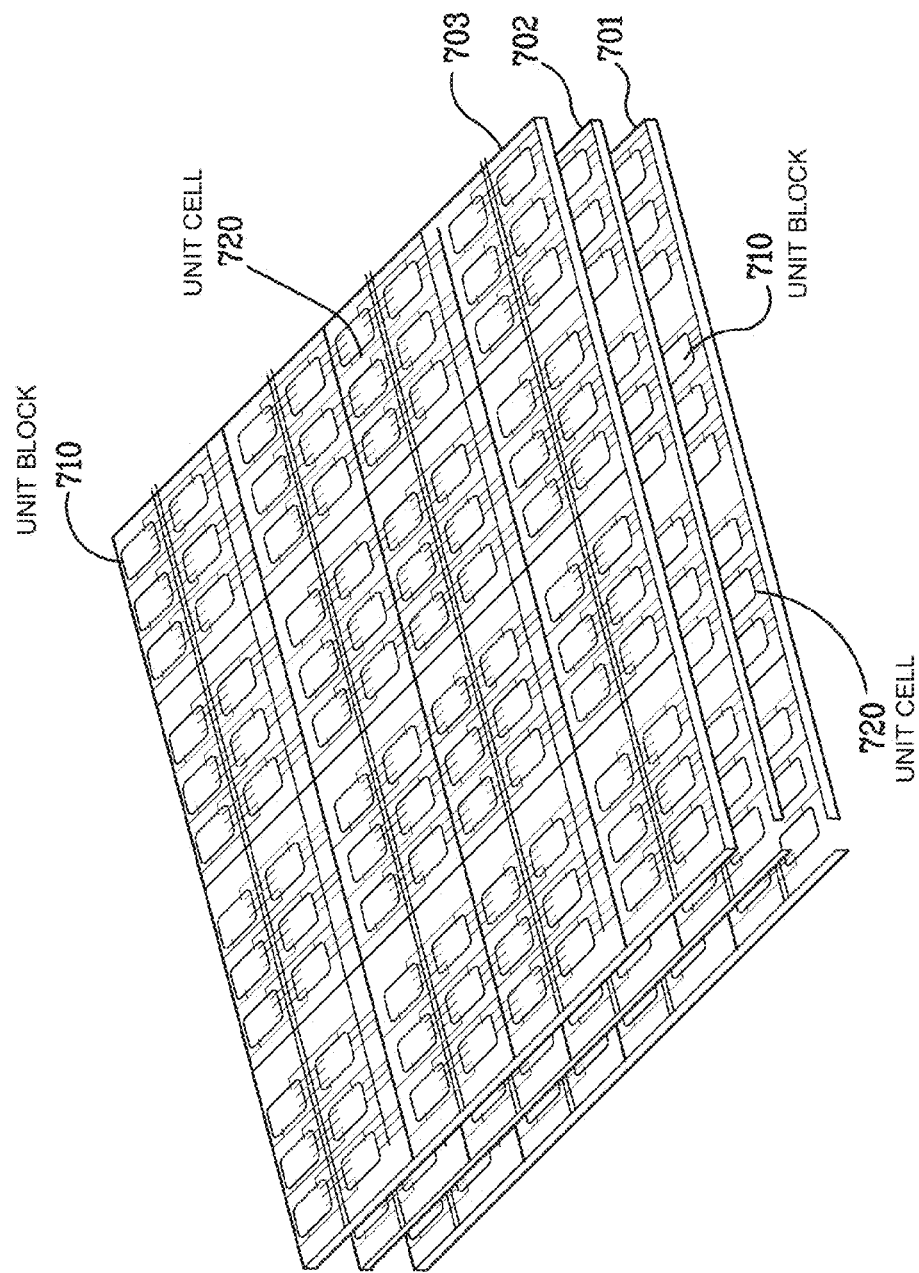
FIG. 7 notionally illustrates a cellular computational platform implemented in a three-level, three-dimensional IC package.

It should be noted that implementations of computational hardware units as described here can be fabricated using known integrated circuit (IC) fabrication techniques such as CMOS techniques and hybrid fabrication techniques. For example, FIG. 7 notionally illustrates a cellular computational platform implemented in a three-level, three-dimensional IC package in which each level 701-703 is formed on a silicon or SOI wafer. Each of regions 710 is e.g. a unit block formed directly on the wafer or formed as a separate chip and attached by flip-chip bonding or the like. Each of regions 720, containing a plurality of unit block regions 710, is e.g. a unit cell. The unit blocks comprised within an individual unit cell may be formed directly on the wafer, or formed on separate chips that are subsequently attached to the wafer, or formed on separate chips and attached by flip-chip bonding or the like to an individual unit cell substrate that is subsequently attached to the wafer by flip-chip bonding or the like.

As is well-known in the art, connections external to the wafers or external to the system as a whole may be made by way of electrical contact pads and optical connectors arrayed along the wafer edges, or within the active chip area, e.g. by way of optical and/or electrical Through Silicon Vias (TSVs).

In general, we expect that our cellular computational platform will find its most useful applications in the fields of pattern recognition, abstraction, prediction, and model adjustment and learning. Although it is not envisaged as a replacement for conventional computers, it is likely to find its most powerful applications in hybrid configurations in which it is combined with conventional computational devices.

What is claimed is:

1. A cellular computational platform comprising:
   a silicon or SOI wafer;
   a multiplicity of functionally identical, repeating computational hardware units that are integrated on the wafer and that are interconnected electrically and optically, thereby forming a hybrid network, wherein:
   the platform further comprises a long-range optical waveguide network, integrated on the silicon or SOI wafer, that interconnects computational hardware units over spans greater than ten nearest-neighbor distances;
   the said long-range optical waveguide network is the only medium that interconnects computational hardware units over spans greater than ten nearest-neighbor distances;
   each computational hardware unit includes a reprogrammable local memory;
   each computational hardware unit is connected to other computational hardware units over interconnections that have reconfigurable weights;
   each computational hardware unit is configured to transmit both electrical and optical signals into the hybrid network for broadcast in a protocol-less manner to other such units in the network, and to respond to protocol-less electrical and optical broadcast messages that it receives from the hybrid network;
   each computational hardware unit is further configured to reprogram its local memory in response to incoming electrical signals or optical signals or both electrical and optical signals;
   at least some of the computational hardware units include an optical transceiver configured to transmit signals in a plurality of distinct optical channels and to receive and demultiplex signals in at least one optical channel;
   the said plurality of distinct optical channels includes at least one common channel adapted to be broadcast to all optically connected computational hardware units and at least one range-limited channel optically coupled to elements that absorb or divert optical power such that optical signals that propagate therein are increasingly attenuated with propagation distance;
   at least some of the optical transceivers are configured to transmit optical signals into the long-range optical waveguide network on long-range channels with sufficient power to be received and detected at computational hardware units more than ten nearest-neighbor distances away;
   some but not all of the optical transceivers are configured to aggregate locally generated signals and to transmit them on long-range channels into the long-range optical waveguide network; and
   some but not all of the optical transceivers are configured to disaggregate signals obtained on long-range channels from the long-range optical waveguide network and to distribute the disaggregated signals to local receivers.

2. The cellular computational platform of claim 1, wherein each computational hardware unit is a unit cell comprising at least one plurality of functionally identical unit blocks, and each unit block comprises a memory and an electro-optical circuit configured to produce electrical and optical output signals in response to electrical and optical input signals, one or more inputs representing conditions of the memory, and one or more control inputs.

3. The cellular computational platform of claim 1, wherein the computational hardware units are organized in two or more distinct layers, the layers are electrically and optically interconnected to each other, and each layer includes a plurality of functionally identical computational hardware units that are functionally distinct from the computational hardware units of the other layer or layers.

4. The cellular computational platform of claim 1, wherein each computational hardware unit comprises:
   at least one optical detector configured to transduce optical input signals to electrical signals;
   a processing element configured to receive signal input from an electrical bus and from the optical detector or detectors, and further configured to generate an output signal in response to the signal input; and
   a pulse-generating circuit configured to generate optical pulses when activated by electrical signals received from the optical detector or detectors, or when activated by output signals received from the processing element, or when activated by a combination of received detector signals and received processing element output signals.

5. The cellular computational platform of claim 4, wherein:
   each of at least some computational hardware units further comprises a summing element configured to compute at least one weighted sum of inputs from a plurality of optical channels; and
   in each of said computational hardware units, the pulse-generating circuit comprises at least one thresholding circuit configured to receive a respective said weighted sum and to trigger the generation of a pulse only when the weighted sum exceeds a threshold.

6. The cellular computational platform of claim 5, wherein, in each of said summing computational hardware units:
   the summing element is configured to compute two or more said weighted sums, each of said sums corresponding to a respective output optical channel;
   each weighted sum is directed to a respective thresholding circuit configured to trigger the generation of a pulse in the corresponding output optical channel only when a respective threshold is exceeded; and
   the summing element is configured to compute different weighted sums of its inputs and direct the different weighted sums to different respective outputs in response to control signals from the processing element or from the local memory or from both the processing element and the local memory.

7. The cellular computational platform of claim 1, configured such that at least some of the reconfigurable weights are negative.

* * * * *